United States Patent
Nakamura et al.

(10) Patent No.: US 11,545,462 B2
(45) Date of Patent: Jan. 3, 2023

(54) MOUNTING APPARATUS AND MOUNTING SYSTEM

(71) Applicant: SHINKAWA LTD., Tokyo (JP)

(72) Inventors: Tomonori Nakamura, Tokyo (JP); Toru Maeda, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 576 days.

(21) Appl. No.: 16/486,155

(22) PCT Filed: Jan. 30, 2018

(86) PCT No.: PCT/JP2018/002950
§ 371 (c)(1),
(2) Date: Dec. 9, 2019

(87) PCT Pub. No.: WO2018/139670
PCT Pub. Date: Aug. 2, 2018

(65) Prior Publication Data
US 2020/0235070 A1  Jul. 23, 2020

(30) Foreign Application Priority Data
Jan. 30, 2017  (JP) .............................. JP2017-014756

(51) Int. Cl.
*H01L 23/00*  (2006.01)

(52) U.S. Cl.
CPC .............. *H01L 24/75* (2013.01); *H01L 24/16* (2013.01); *H01L 2224/16145* (2013.01);
(Continued)

(58) Field of Classification Search
None
See application file for complete search history.

(56) References Cited

U.S. PATENT DOCUMENTS 5,698,068 A * 12/1997 Ichikawa .............. B29C 66/836
156/581
6,821,381 B1 * 11/2004 Yamauchi ......... B29C 66/81261
156/583.1
(Continued)

FOREIGN PATENT DOCUMENTS

CN        104282586        1/2015
JP        H11121921        4/1999
(Continued)

OTHER PUBLICATIONS

"International Search Report (Form PCT/ISA/210)" of PCT/JP2018/002950, dated Mar. 27, 2018, with English translation thereof, pp. 1-3.

(Continued)

*Primary Examiner* — Devang R Patel
(74) *Attorney, Agent, or Firm* — JCIPRNET

(57) ABSTRACT

A mounting apparatus for stacking and mounting two or more semiconductor chips at a plurality of locations on a substrate includes: a first mounting head for forming, at a plurality of locations on the substrate, temporarily stacked bodies in which two or more semiconductor chips are stacked in a temporarily press-attached state; and a second mounting head for forming chip stacked bodies by sequentially finally press-attaching the temporarily stacked bodies formed at the plurality of locations. The second mounting head includes: a press-attaching tool for heating and pressing an upper surface of a target temporarily stacked body to thereby finally press-attach the two or more semiconductor chips configuring the temporarily stacked body altogether; and one or more heat-dissipation tools having a heat-dissipating body which, by coming into contact with an upper surface of another stacked body positioned around the
(Continued)

target temporarily stacked body, dissipates heat from the another stacked body.

8 Claims, 6 Drawing Sheets

(52) U.S. Cl.
CPC .............. *H01L 2224/75301* (2013.01); *H01L 2224/75502* (2013.01); *H01L 2224/75745* (2013.01)

(56) References Cited

U.S. PATENT DOCUMENTS

| | | | | |
|---|---|---|---|---|
| 8,381,963 | B2* | 2/2013 | Nakamura | H01L 24/97 228/256 |
| 8,925,608 | B2* | 1/2015 | Mayr | H01L 21/67103 156/359 |
| 9,425,162 | B2* | 8/2016 | Wasserman | B23K 3/02 |
| 2005/0061856 | A1* | 3/2005 | Maki | H01L 24/29 228/234.1 |
| 2008/0314264 | A1* | 12/2008 | Kuster | H01L 21/67092 100/179 |
| 2009/0291524 | A1* | 11/2009 | Takahashi | H01L 25/50 438/108 |
| 2011/0065239 | A1 | 3/2011 | Hosomi | |
| 2012/0222808 | A1 | 9/2012 | Hamazaki | |
| 2013/0032270 | A1* | 2/2013 | Mawatari | H01L 24/81 156/60 |
| 2014/0001162 | A1* | 1/2014 | Tanaka | B23K 26/352 219/121.6 |
| 2017/0136570 | A1* | 5/2017 | Seok | B23K 20/026 |

FOREIGN PATENT DOCUMENTS

| | | |
|---|---|---|
| JP | 2004274026 | 9/2004 |
| JP | 2006049739 | 2/2006 |
| JP | 2011061073 | 3/2011 |
| JP | 2011109046 | 6/2011 |
| WO | WO-2015133446 A1 * | 9/2015 ............. H01L 24/75 |

OTHER PUBLICATIONS

Noboru Aasahi et al., "Heat Transfer Analysis in the Thermal Compression Bonding for CoW Process," International Conference on Electronics Packaging (ICEP), Apr. 20-22, 2016,pp. 640-643.
Office Action of China Counterpart Application, with English translation thereof, dated Oct. 31, 2022, pp. 1-14.

* cited by examiner

MOUNTING APPARATUS AND MOUNTING SYSTEM

CROSS-REFERENCE TO RELATED APPLICATION

This application is a 371 application of an international PCT application serial no. PCT/JP2018/002950, filed on Jan. 30, 2018, which claims the priority benefit of Japan application JP2017-014756, filed on Jan. 30, 2017. The entirety of each of the above-mentioned patent applications is hereby incorporated by reference herein and made a part of this specification.

BACKGROUND OF THE INVENTION

Technical Field

The present invention relates to a mounting apparatus and a mounting system for stacking and mounting two or more semiconductor chips at a plurality of locations on a substrate.

Related Art

Conventionally, there is a demand for a semiconductor device having higher functionality and a smaller size. Therefore, some documents of literature propose that a plurality of semiconductor chips are stacked and mounted. In general, a bump and a non-conductive film (hereinafter, referred to as the "NCF") that covers the bump are arranged on one surface of a semiconductor chip. The NCF is made of thermosetting resin and reversibly softens as the temperature increases when the temperature is lower than a predetermined hardening start temperature but irreversibly hardens as the temperature increases when the temperature is higher than the hardening start temperature. In order to stack and mount the semiconductor chips, the following is proposed. A plurality of semiconductor chips are stacked while being temporarily press-attached, and then a stacked body in the temporarily press-attached state is heated and pressed to be finally press-attached. Moreover, hereinafter, the stacked body in the temporarily press-attached state is referred to as a "temporarily stacked body", and the stacked body after final press-attachment is referred to as a "chip stacked body". In addition, when there is no need to distinguish between the temporarily stacked body and the chip stacked body, both are simply referred to as the "stacked body". According to such technologies, it is possible to mount more semiconductor chips in a small area, and thus it is possible to achieve higher functionality and smaller size.
[Literature of Related Art]
[Non-Patent Literature]
Non-Patent Literature 1: "Heat Transfer Analysis in the Thermal Compression Bonding for CoW Process" by Noboru Asahi et al. in ICEP 2016 Proceedings, pp. 640-643

SUMMARY

Problems to be Solved

Meanwhile, a plurality of chip stacked bodies are mounted on one substrate, in general. In a case of mounting the plurality of chip stacked bodies, some documents of literature propose a technology in which a plurality of temporarily stacked bodies are formed, and then the plurality of temporarily stacked bodies are sequentially finally press-attached. According to the corresponding technology, it is possible to reduce the number of times of switching between a temporarily press-attaching process and a finally press-attaching process, and thus it is possible to further simplify and shorten a mounting step, compared with a case in which temporary press-attachment and final press-attachment of one stacked body are completed, and then temporary press-attachment and final press-attachment of the next stacked body are performed.

On the other hand, in a case of a technology in which the final press-attachment is performed after a plurality of temporarily stacked bodies are formed, heat applied to one temporarily stacked body for the final press-attachment is also transmitted to an adjacent temporarily stacked body in some cases. In particular, when the substrate has a high heat transfer rate, the heat for the final press-attachment which is applied to one temporarily stacked body is transmitted to the adjacent temporarily stacked body with high efficiency and brings about an increase in temperature of the temporarily stacked body. In this case, there is a concern that the NCF will irreversibly harden in the other temporarily stacked body. When the NCF hardens before final press-attachment, the semiconductor chip and the substrate are inhibited from being appropriately joined to each other.

Here, Non-Patent Literature 1 proposes a technology in which, when one semiconductor chip is finally press-attached, cooling air is applied to an adjacent semiconductor chip, and thereby an increase in temperature of the adjacent semiconductor chip and eventually hardening of the NCF are prevented. However, in a case of performing cooling with cooling air, a problem arises in that not only cooling efficiency is degraded but also it is difficult to limit a cooling range. As a result, there is a concern that part of the cooling air reaches not only the adjacent semiconductor chip being a cooling target but also an adjacent semiconductor chip being finally press-attached, a temperature of the semiconductor chip being finally press-attached will decrease, and defective mounting will be brought about.

Therefore, an objective of the present invention is to provide a mounting apparatus and a mounting system that is capable of more appropriately mounting semiconductor chips when a plurality of temporary chip stacked bodies are formed and then the temporary chip stacked bodies are sequentially finally press-attached.

Means to Solve Problems

A mounting apparatus of the present invention is a mounting apparatus for stacking and mounting two or more semiconductor chips at a plurality of locations on a substrate, the mounting apparatus including: a temporary press-attachment head for forming, at a plurality of locations on the substrate, temporarily stacked bodies in which two or more semiconductor chips are stacked in a temporarily press-attached state; and a final press-attachment head for forming chip stacked bodies by sequentially finally press-attaching the temporarily stacked bodies formed at the plurality of locations. The final press-attachment head has a press-attaching tool for heating and pressing an upper surface of a target temporarily stacked body to thereby finally press-attach the two or more semiconductor chips configuring the temporarily stacked body altogether, and one or more heat-dissipation tools having a heat-dissipating body which, by coming into contact with upper surfaces of another stacked body positioned around the target temporarily stacked body, dissipates heat from the another stacked body.

According to this configuration, when final press-attachment is performed, the another stacked body positioned around the target stacked body can be pinpointed and cooled, and thus it is possible to prevent an NCF from hardening in the stacked body before the final press-attachment, while preventing a decrease in temperature of the stacked body being finally press-attached.

In addition, the final press-attachment head may further include a base to which the press-attaching tool and the heat-dissipation tools are attached, and the press-attaching tool and the heat-dissipation tools may be lifted and lowered in connection with each other by lifting and lowering the base.

According to this configuration, lifting and lowering of the press-attaching tool and the heat-dissipation tools can be integrally controlled, and thus the control can be simplified.

In addition, in this case, the heat-dissipation tools may be attached to the base via an elastic body and may be enabled to be lifted and lowered with respect to the base within a range of an amount of elastic deformation of the elastic body.

According to this configuration, variations in height of the stacked body can be absorbed by the elastic body, and thus the one or more heat-dissipation tools can be reliably brought into contact with the stacked body.

In addition, in this case, a height of a bottom surface of the heat-dissipation tool in a no-load state may be lower than a height of a bottom surface of the press-attaching tool.

According to this configuration, by lowering the heat-dissipation tool capable of absorbing the variations in height of the stacked body, both the heat-dissipation tools and the press-attaching tool can reliably come into contact with the stacked body.

In addition, the heat-dissipating body may be cooled by a refrigerant.

According to this configuration, other stacked bodies positioned around the target stacked body can be more effectively cooled.

In addition, the final press-attachment head may have one of the press-attaching tool and eight of the heat-dissipation tools, and the press-attaching tool and the heat-dissipation tools may be arranged in three rows and three columns with the press-attaching tool as a center.

According to this configuration, it is possible to cool all of the stacked bodies around the stacked body being finally press-attached.

A mounting system of the present invention is a mounting system for stacking and mounting two or more semiconductor chips at a plurality of locations on a substrate, the mounting system including: a temporary press-attaching device for forming, at a plurality of locations on the substrate, temporarily stacked bodies in which two or more semiconductor chips are stacked in a temporarily press-attached state; and a final press-attaching device for forming chip stacked bodies by sequentially finally press-attaching the temporarily stacked bodies formed at the plurality of locations by the temporary press-attaching device. The final press-attaching device has a press-attaching tool for heating and pressing an upper surface of a target temporarily stacked body to thereby finally press-attach the two or more semiconductor chips configuring the temporarily stacked body altogether, and one or more heat-dissipation tools having a heat-dissipating body which, by coming into contact with an upper surface of another stacked body positioned around the target temporarily stacked body, dissipates heat from the another stacked body. [Effect]

Effect

According to the present invention, when final press-attachment is performed, other stacked bodies positioned around a target stacked body can be pinpointed and cooled, and thus it is possible to prevent an NCF from hardening in the stacked body before the final press-attachment, while preventing a decrease in temperature of the stacked body being finally press-attached.

DESCRIPTION OF THE EMBODIMENTS

Figure 1:
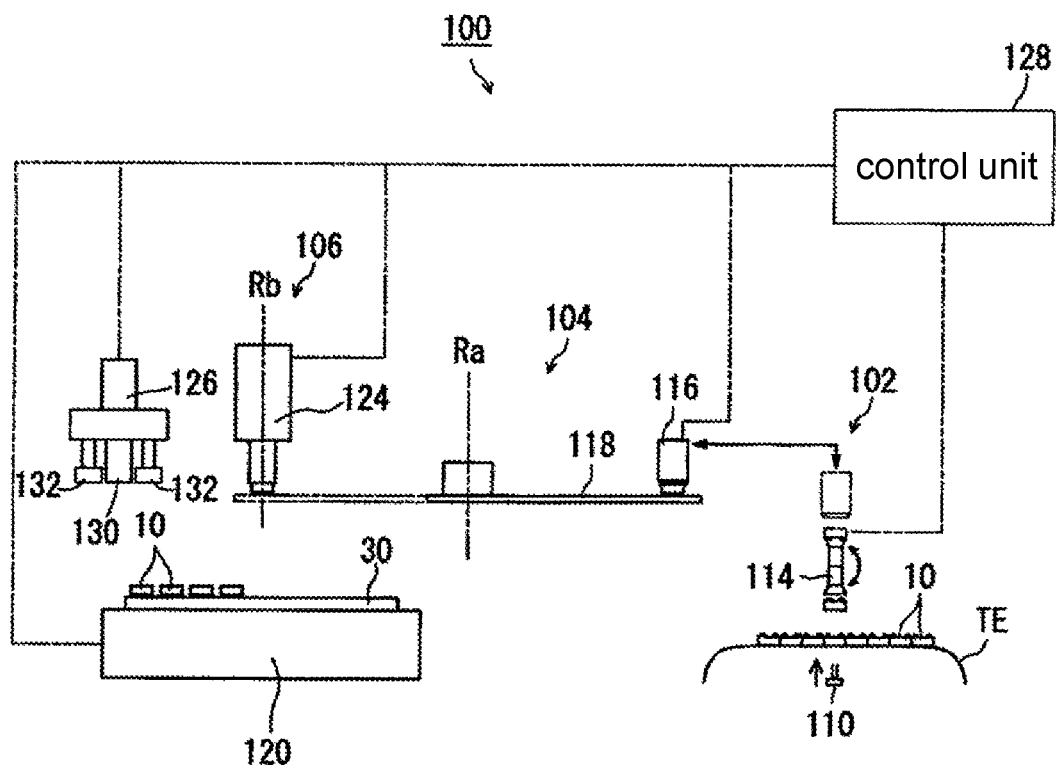
FIG. 1 is a diagram showing a configuration of a mounting apparatus according to an embodiment of the present invention.

Hereinafter, embodiments of the present invention are described with reference to the drawings. FIG. 1 is a diagram of a schematic configuration of a mounting apparatus 100 according to an embodiment of the present invention. The mounting apparatus 100 is a device that mounts a semiconductor chip 10 on a substrate 30. The mounting apparatus 100 has a configuration which is particularly preferred in a case of stacking and mounting a plurality of semiconductor chips 10. Moreover, in the following description, bodies formed by stacking a plurality of semiconductor chips 10 are referred to as "stacked bodies ST", further, the "stacked bodies ST" are distinguished as follows. A body of the plurality of semiconductor chips 10 in a temporarily press-attached state is referred to as a "temporarily stacked body STt", and a body of the plurality of semiconductor chips 10 in a finally press-attached state is referred to as a "chip stacked body STc".

The mounting apparatus 100 includes a chip supply unit 102, a chip transport unit 104, a bonding unit 106, and a control unit 128 that controls drive of the units. The chip supply unit 102 is a part that picks up the semiconductor chip 10 from a chip supply source and supplies the semiconductor chip to the chip transport unit 104. The chip supply unit 102 has a projecting-upward portion 110, a die picker 114, and a transport head 116.

In the chip supply unit 102, a plurality of semiconductor chips 10 are placed on a dicing tape TE. In this case, the semiconductor chip 10 is placed in a face-up state in which a bump 18 faces upward. The projecting-upward portion 110 pushes up only one semiconductor chip 10 of the plurality of semiconductor chips 10 while the semiconductor chips are in the face-up state. The die picker 114 suction-holds and receives, by a lower end of the die picker, the semiconductor chip 10 pushed up by the projecting-upward portion 110. The die picker 114 that has received the semiconductor chip 10 rotates by 180 degrees at this position so that the bump 18 of the semiconductor chip 10 faces downward, that is, so that the semiconductor chip 10 comes into a face-down state. In this state, the transport head 116 receives the semiconductor chip 10 from the die picker 114.

The transport head 116 is movable in up-down and horizontal directions and can suction-hold the semiconductor chip 10 by a lower end of the transport head. When the die picker 114 rotates by 180 degrees and the semiconductor chip 10 comes into the face-down state, the transport head 116 suction-holds the semiconductor chip 10 by the lower end of the transport head. Then, the transport head 116 moves in the horizontal and up-down directions to move to the chip transport unit 104.

The chip transport unit 104 has a rotary table 118 that rotates around a vertical rotation axis Ra. The transport head 116 places the semiconductor chip 10 at a predetermined position of the rotary table 118. The rotary table 118, at which the semiconductor chip 10 is placed, rotates around the rotation axis Ra, and thereby the semiconductor chip 10 is transported to the bonding unit 106 that is positioned at an opposite side of the chip supply unit 102.

The bonding unit 106 includes a first mounting head 124 (temporary press-attachment head) that temporarily press-attaches the semiconductor chip 10 or a stage 120 which supports the substrate 30, a second mounting head 126 (final press-attachment head) that finally press-attaches the semiconductor chip 10, and the like. The stage 120 is movable in the horizontal direction and adjust a relative positional relationship between the substrate 30 placed thereon and the mounting heads 124 and 126. In addition, a heater is internally arranged in the stage 120, and the heater heats the semiconductor chip 10 from below.

The first mounting head 124 can hold the semiconductor chip 10 by a lower end of the first mounting head and can rotate around a vertical rotary axis Rb and can be lifted and lowered. In addition, the first mounting head 124 has a built-in heater (not shown) and is heated to a set first temperature T1. The first mounting head 124 functions as a temporary press-attachment head that temporarily press-attaches the semiconductor chip 10 on the substrate or another semiconductor chip 10.

The second mounting head 126 can be lifted and lowered. In addition, the second mounting head 126 has a built-in heater (not shown) and is heated to a second temperature T2 higher than the first temperature T1. The second mounting head 126 functions as a final press-attachment head that heats and presses the temporarily press-attached semiconductor chips 10 at the second temperature T2, thereby finally attaching the semiconductor chips 10. Here, the second mounting head 126 of the embodiment has one press-attaching tool 130 that performs heating and pressing by coming into contact with the target semiconductor chip 10 (more accurately, the temporarily stacked body STt) and a plurality of heat-dissipation tools 132 arranged around the press-attaching tool 130. A specific configuration of the press-attaching tool 130 or the heat-dissipation tool 132 is described later in detail.

A camera (not shown) is arranged in the vicinity of the first mounting head 124 and the second mounting head 126. An alignment mark which is a positioning reference is attached to each of the substrate 30 and the semiconductor chip 10. The camera images the substrate 30 and the semiconductor chip 10 in a manner that the alignment mark appears. Based on image data obtained by the imaging, the control unit 128 grasps a relative positional relationship between the substrate 30 and the semiconductor chip 10 and adjusts a rotation angle of the first mounting head 124 around the axis Rb and a horizontal position of the stage 120 as necessary. The control unit 128 controls drive of the units and includes, for example, a CPU that performs various types of arithmetic processes and a storage section that stores various items of data or programs.

Figure 2:
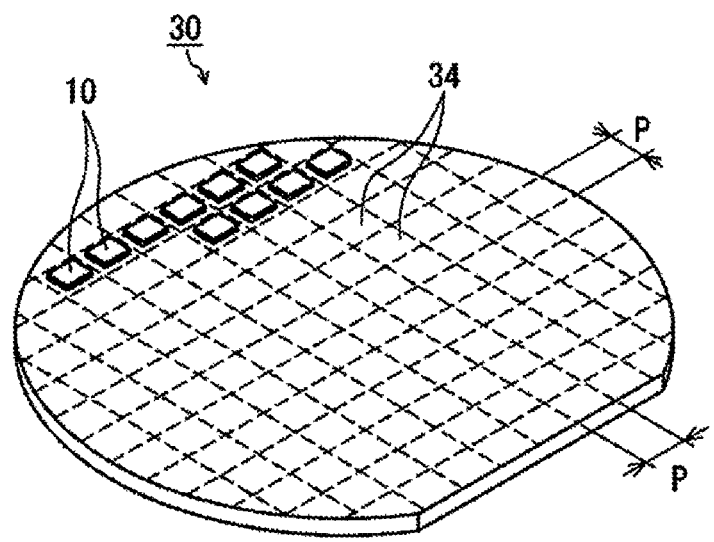
FIG. 2 is a diagram showing an example of a substrate.

Next, a semiconductor device which is manufactured by the mounting apparatus 100 is described. In the embodiment, a semiconductor wafer is used as the substrate 30, and a plurality of semiconductor chips 10 are stacked and mounted on the semiconductor wafer (substrate 30). Hence, a mounting process of the embodiment is a "chip-on-wafer process" of stacking and mounting the semiconductor chip 10 on a circuit forming surface of the semiconductor wafer. FIG. 2 is a schematic image view of the substrate 30 (semiconductor wafer) used in the embodiment. The substrate 30 which is a semiconductor wafer is mainly made of silicon and has a heat transfer coefficient higher than that of a general circuit substrate made of resin or glass. As shown in FIG. 2, a plurality of arrangement regions 34 arranged in a grid shape are set on the substrate 30. The plurality of semiconductor chips 10 are stacked and mounted in the arrangement regions 34. The arrangement regions 34 are arranged at predetermined arrangement pitches P. A value of the arrangement pitch P is appropriately set depending on a size or the like of the semiconductor chip 10 as a mounting target. In addition, in the embodiment, the arrangement region 34 has a substantially square shape; however, the arrangement region 34 may have another shape such as a substantially rectangular shape.

Figure 3:
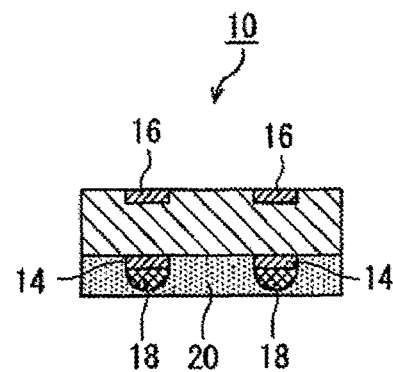
FIG. 3 is a diagram showing a configuration of a semiconductor chip.

Next, a configuration of the semiconductor chip 10 is described. FIG. 3 is a diagram showing a schematic configuration of the semiconductor chip 10 which is mounted. Electrode terminals 14 and 16 are formed on upper and lower surfaces of the semiconductor chip 10. In addition, the bumps 18 are formed to be continuous to the electrode terminals 14 on one surface of the semiconductor chip 10. The bump 18 is made of conductive metal and melts at a predetermined melting temperature Tm.

In addition, a non-conductive film (hereinafter, referred to as the "NCF") 20 is bonded to the one surface of the semiconductor chip 10 so as to cover the bump 18. The NCF 20 functions as an adhesive for adhering the semiconductor chip 10 to the substrate 30 or another semiconductor chip 10 and is made of non-conductive thermosetting resin such as polyimide resin, epoxy resin, acrylic resin, phenoxy resin, polyester sulfone resin or the like. The NCF 20 has a thickness larger than an average height of the bumps 18, and the bumps 18 are substantially completely covered by the NCF 20. The NCF 20 is a solid film at room temperature; however, when the temperature is higher than a predetermined softening start temperature Ts, the NCF reversibly softens gradually to exert fluidity and, when the temperature is higher than a predetermined hardening start temperature Tt, the NCF starts to irreversibly harden.

Here, the softening start temperature Ts is lower than the melting temperature Tm of the bump 18 and the hardening start temperature Tt. The first temperature T1 for temporary press-attachment is higher than the softening start temperature Ts and is lower than the melting temperature Tm and the hardening start temperature Tt. In addition, the second temperature T2 for final press-attachment is higher than the melting temperature Tm and the hardening start temperature Tt. That is, Ts<T1<(Tm, Tt)<T2 is satisfied.

When the semiconductor chip 10 is temporarily press-attached to the substrate 30 or a semiconductor chip 10 at a lower side (hereinafter, referred to as a "lower chip or the like"), the first mounting head 124 is heated to the first temperature T1 and then pushes and presses the semiconductor chip 10 to the lower chip or the like. In this case, the NCF 20 of the semiconductor chip 10 is heated to the softening start temperature Ts or higher by the heat transmitted from the first mounting head 124, thereby softening and having fluidity. Consequently, the NCF 20 can enter a gap between the semiconductor chip 10 and the lower chip or the like, and the gap can be reliably filled with the NCF.

When the semiconductor chip 10 is finally press-attached, the second mounting head 126 is heated to the second temperature T2 and, then, presses the semiconductor chip 10. At this time, the bumps 18 and the NCF 20 of the semiconductor chip 10 are heated to a temperature equal to or higher than the hardening start temperature Tt and the melting temperature Tm by the heat transmitted from the second mounting head 126. Consequently, the bumps 18 can melt and adhere to the lower chip or the like that faces the bumps 18. In addition, the NCF 20 hardens due to the heating in a state that the gap between the semiconductor chip 10 and the lower chip or the like is filled with the NCF, and thus the semiconductor chip 10 and the lower layer are strongly fixed.

Figure 4:
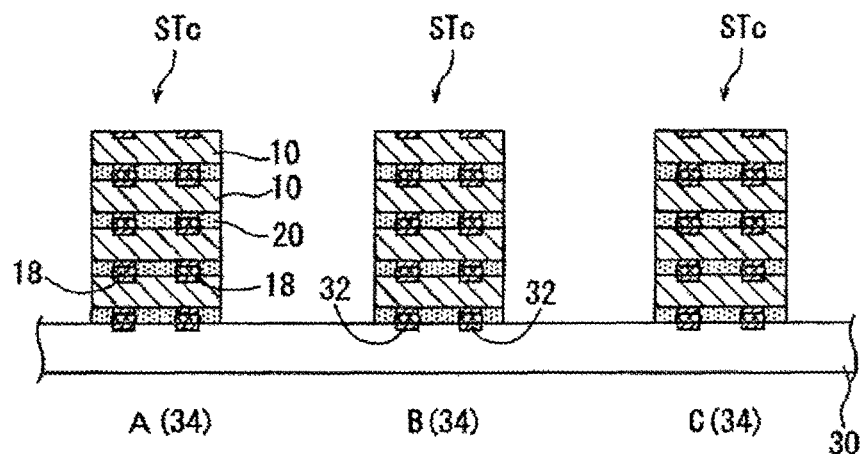
FIG. 4 is a diagram showing a configuration of a semiconductor device.

FIG. 4 is a diagram showing a configuration of a semiconductor device in which a plurality of semiconductor chips 10 are stacked and mounted on the electrode 32 on the substrate 30. In the semiconductor device, chip stacked bodies STc formed by stacking and mounting semiconductor chips 10 having a target stacking number are arranged in a plurality of arrangement regions 34 (regions A to C, in the example shown in the drawing), respectively. In the embodiment, the target stacking number is "4", and the chip stacked body STc containing four semiconductor chips 10 is mounted in one arrangement region 34.

The semiconductor device described above is manufactured in the following procedure. First, the first mounting head 124 is used to form a plurality of temporarily stacked bodies STt formed by stacking the semiconductor chips 10 while temporarily press-attaching the semiconductor chips 10. In the example of FIG. 4, when the temporarily stacked body STt is formed at the region A, subsequently, the temporarily stacked body STt is formed at the region B, and then the temporarily stacked body STt is further formed at the region C.

When the temporarily stacked bodies STt are formed at all of the arrangement regions 34, then, the temporarily stacked bodies STt are finally press-attached sequentially. That is, the second mounting head 126 heated to the second temperature T2 is used to heat and press an upper surface of a target temporarily stacked body STt and to finally press-attach the plurality of (in the example, four) semiconductor chips 10 configuring the target temporarily stacked body STt altogether. Consequently, the temporarily stacked body STt changes into the chip stacked bodies STc in which the semiconductor chips 10 configuring the temporarily stacked body are finally press-attached. When one temporarily stacked body STt is finally press-attached (changes into the chip stacked body STc), subsequently, the next temporarily stacked body STt is finally press-attached. Then, all of the temporarily stacked bodies STt are finally press-attached, and a manufacturing process is ended.

Figure 5:
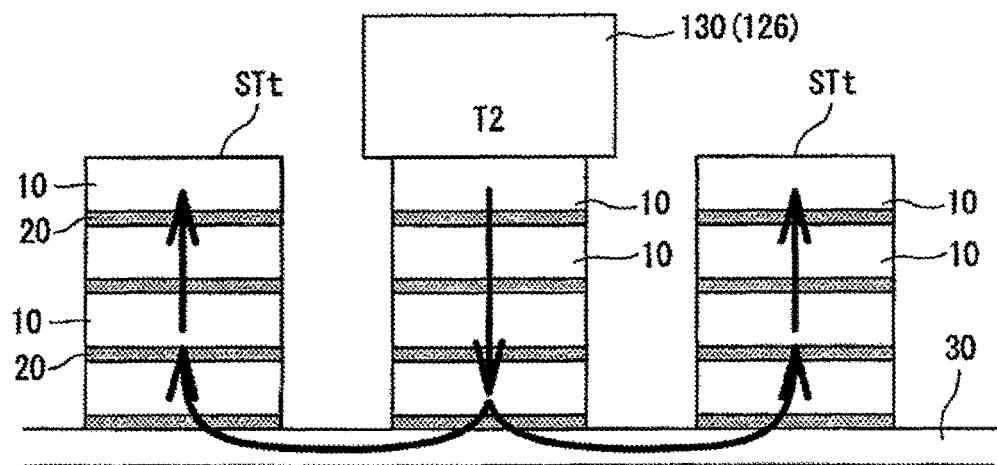
FIG. 5 is a diagram showing a state of final press-attachment in the related art.

In a case of a method that performs, in the above manner, the final press-attachment after the plurality of temporarily stacked bodies STt are formed, the number of times of switching between the mounting heads or the like can be reduced, and thus processing time of the complete mounting processing can be reduced, compared with a method that performs final press-attachment after one temporarily stacked body STt is formed. On the other hand, in the case of the method that performs the final press-attachment after the plurality of temporarily stacked bodies STt are formed, a problem arises in that the NCF 20 irreversibly hardens in the temporarily stacked body STt other than the temporarily stacked body STt which is a target of the final press-attachment. This is described with reference to FIG. 5. FIG. 5 is an image view showing a state of the final press-attachment in the related art.

As described above, when one temporarily stacked body STt is finally press-attached to change into the chip stacked body STc, the upper surface of the temporarily stacked body STt is heated and pressed by the mounting head for final press-attachment. In a conventional mounting apparatus, as shown in FIG. 5, a mounting head for final press-attachment has only a press-attaching tool 130 that heats and presses the temporarily stacked body STt and does not have the heat-dissipation tool 132 that dissipates heat from adjacent temporarily stacked bodies STt.

A case is considered in which the conventional mounting apparatus described above is used to finally press-attach the temporarily stacked body STt at the middle region B after the temporarily stacked bodies STt are formed at the regions A, B, and C. In this case, the press-attaching tool 130 is used to heat and press the temporarily stacked body STt at the region B. At this time, the second temperature T2 which is the temperature of the press-attaching tool 130 is set to be higher than the hardening start temperature Tt of the NCF 20 and the melting temperature Tm of the bumps 18 of the lowest semiconductor chip 10. Then, the semiconductor chip 10 is heated at the second temperature T2, and thereby the bumps 18 of the target temporarily stacked body STt (temporarily stacked body STt at the region B in FIG. 5) melt, and the NCF 20 starts to irreversibly harden.

Here, as shown by thick arrows in FIG. 5, the heat applied from the press-attaching tool 130 is transmitted not only to the temporarily stacked body STt at the region B which is a target of final press-attachment, but also to the temporarily stacked body STt at the adjacent region A or C via the substrate 30. In particular, when the substrate 30 has high heat conductivity like a semiconductor wafer, heat is transmitted to an adjacent temporarily stacked body STt with high efficiency. As a result, not only the target of final press-attachment but also the adjacent temporarily stacked bodies STt are heated to the hardening start temperature Tt of the NCF 20 or higher, and there is a concern that the NCF 20 of the temporarily stacked bodies STt at the regions A and C irreversibly harden before the final press-attachment. When the NCF 20 hardens before the final press-attachment, defective mounting of the semiconductor chip 10 is brought about. In addition, even when the temporarily stacked bodies STt are not heated to the hardening start temperature Tt or higher, a start of reaction of a hardening agent contained in the NCF 20 needs to be sufficiently considered. In this case, it is difficult to obtain original characteristics of the NCF 20.

Figure 6:
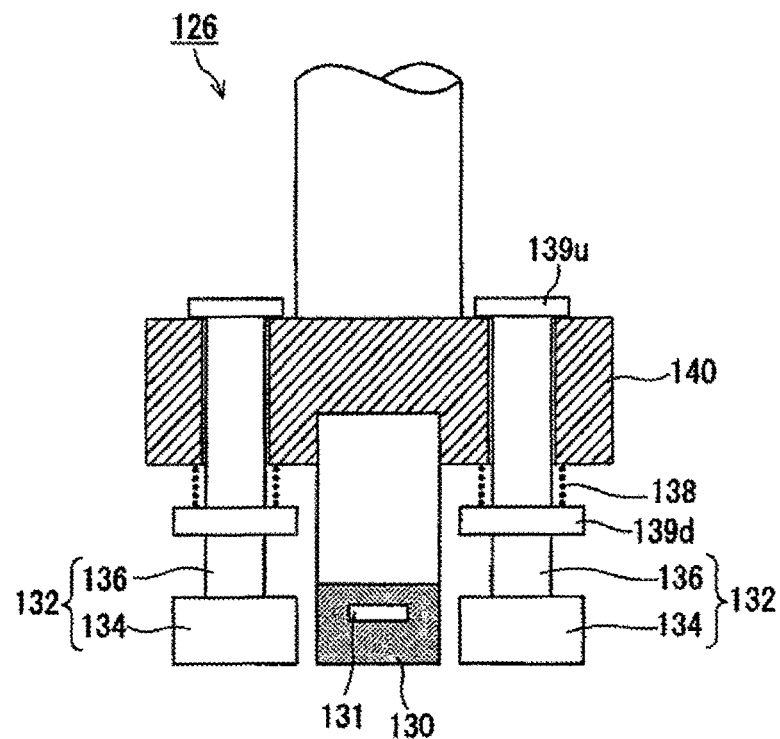
FIG. 6 is a diagram showing a configuration of a second mounting head.
Figure 7:
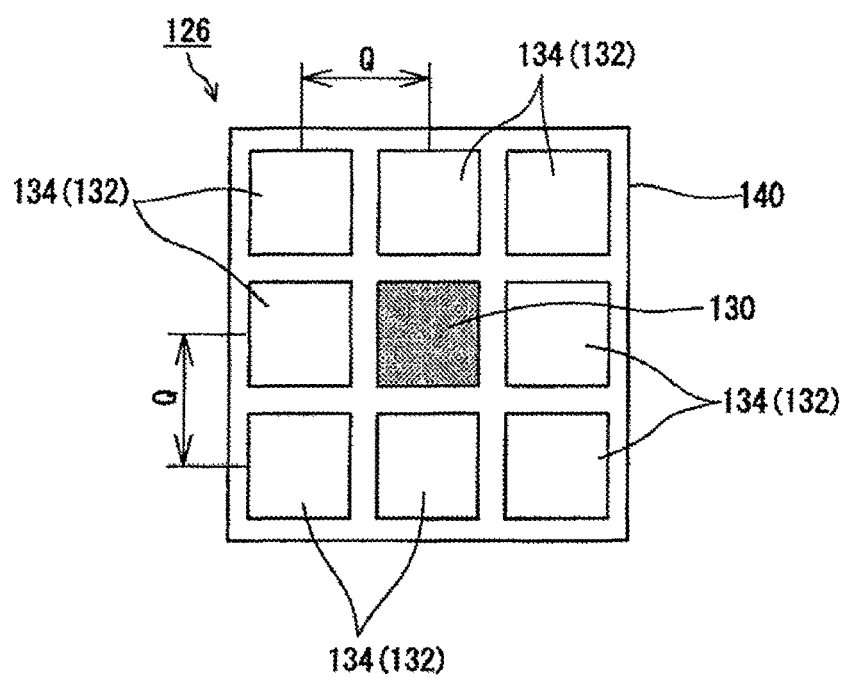
FIG. 7 is a diagram of the second mounting head when viewed from a bottom surface side.

Therefore, in the embodiment, in order to prevent the hardening of the NCF 20 of the temporarily stacked body STt other than the temporarily stacked body STt being the target of final press-attachment, the second mounting head 126 is equipped with not only the press-attaching tool 130 but also the heat-dissipation tool 132. This is described with reference to FIGS. 6 and 7. FIG. 6 is a diagram showing a schematic configuration of the second mounting head 126. In addition, FIG. 7 is a diagram of the second mounting head 126 when viewed from a bottom side.

The second mounting head 126 has a base 140 and the press-attaching tool 130 and the heat-dissipation tools 132 attached to the base 140. The base 140 is attached to a lifting/lowering mechanism not shown and is lifted and lowered in response to an instruction from the control unit 128.

The press-attaching tool 130 is pressed against the upper surface of the temporarily stacked body STt being the target of final press-attachment, thereby pressing and heating the temporarily stacked body STt. The press-attaching tool 130 has a heater 131 arranged internally and is heated to the set second temperature T2.

An upper end of the press-attaching tool 130 is fixed to the base 140, and a position of the press-attaching tool 130 with respect to the base 140 does not change.

The heat-dissipation tools 132 are arranged in eight directions around the press-attaching tool 130. In FIG. 7, outline quadrangles represent the heat-dissipation tools 132, and a hatched quadrangle represents the press-attaching tool 130. As shown in FIG. 7, the second mounting head 126 has one press-attaching tool 130 and eight heat-dissipation tools 132, and the press-attaching tool 130 and the heat-dissipation tools 132 are arranged in three rows and three columns with the press-attaching tool 130 as a center. An arrangement pitch Q of the press-attaching tool 130 and the heat-dissipation tools 132 is the same as the arrangement pitch P of the stacked bodies ST. Hence, when the press-attaching tool 130 comes into contact with one stacked body ST, the heat-dissipation tools 132 adjacent to the press-attaching tool 130 come into contact with other stacked bodies ST adjacent to the one stacked body ST.

The heat-dissipation tool 132 dissipates heat from other stacked bodies ST apart from the stacked body ST being the target of final press-attachment to cool the other stacked bodies. A heat-dissipating body 134 is arranged at a lower end of the heat-dissipation tool 132. The heat-dissipating body 134 is a block-shaped member containing a material having a high heat transfer rate, such as copper, aluminium or the like. The heat-dissipating body 134 functions as a heat sink that comes into contact with upper surfaces of other stacked bodies ST around the temporarily stacked body STt being the target of final press-attachment and dissipates heat from the other stacked bodies ST. The heat transmitted from the other stacked bodies ST to the heat-dissipating body 134 is released to external air, a columnar body 136 to be described below, or the like.

Moreover, in FIG. 6, the heat-dissipating body 134 has a simple rectangular parallelepiped shape; however, the shape of the heat-dissipating body 134 may be appropriately modified. For example, in order to improve dissipation efficiency of the heat-dissipating body 134, a plurality of fins, ribs, or protrusions may be arranged on an upper surface or a lateral surface of the heat-dissipating body 134. In addition, in order to improve cooling performance of the heat-dissipating body 134, the heat-dissipating body 134 may be cooled by using a refrigerant. That is, a refrigerant channel through which the inside and the outside of the heat-dissipating body 134 communicate with each other may be arranged to make a liquid refrigerant or gaseous refrigerant circulate in the refrigerant channel. In addition, as another example, heat of the heat-dissipating body 134 may be transferred to the outside of the heat-dissipating body by using a heat pipe. In addition, as still another example, the heat-dissipating body 134 may be cooled by using a Peltier element. In both examples, it is desirable that a bottom surface of the heat-dissipating body 134, that is, a contact surface with the stacked body ST, is a flat surface so as to come into contact with the entire upper surface of the stacked body ST. Moreover, in order to prevent temperature decrease of the press-attaching tool 130, it is desirable that an optional insulation member (not shown) is arranged between the press-attaching tool 130 and the heat-dissipation tools 132.

In addition, the heat-dissipating body 134 is attached to the base 140 via an elastic body 138 and can be lifted and lowered with respect to the base 140 within a range of an amount of elastic deformation of the elastic body 138. Various methods for attaching via the elastic body 138 are considered and, in the embodiment, as shown in FIG. 6, the columnar body 136 is inserted through a through-hole which penetrates the base 140, and flanges 139*u* and 139*d* having a diameter larger than that of the through-hole are arranged at both sides of the columnar body 136 with the base 140 interposed therebetween. Then, a compression spring serving as the elastic body 138 is disposed between a bottom surface of the base 140 and the lower flange 139*d*. The compression spring biases the lower flange 139*d*, eventually the heat-dissipating body 134, downward in a no-load state. On the other hand, when the heat-dissipating body 134 receives an upward force as a reaction force when the heat-dissipating body 134 pushes the stacked body ST, the compression spring is compressively deformed, and thereby the heat-dissipating body 134 is displaced in a direction in which the heat-dissipating body approaches the base 140.

By attaching the heat-dissipation tool 132 to the base 140 via the elastic body 138 in this way, a difference in height for each stacked body ST can be absorbed, and all of the eight heat-dissipating bodies 134 can come into close contact with the upper surface of the corresponding stacked body ST. Moreover, in order for the heat-dissipating body 134 to reliably come into close contact with the corresponding stacked body ST, it is desirable that a height of the bottom surface of the heat-dissipating body 134 in the no-load state (state in which the elastic body is not deformed) is lower than the height of the bottom surface of the press-attaching tool 130 (be separated from the base 140). In addition, it is desirable that a spring constant of the elastic body 138 is adjusted so that the elastic body 138 can be elastically deformed under a first load F1 which is a load for the temporary press-attachment.

Figure 8:
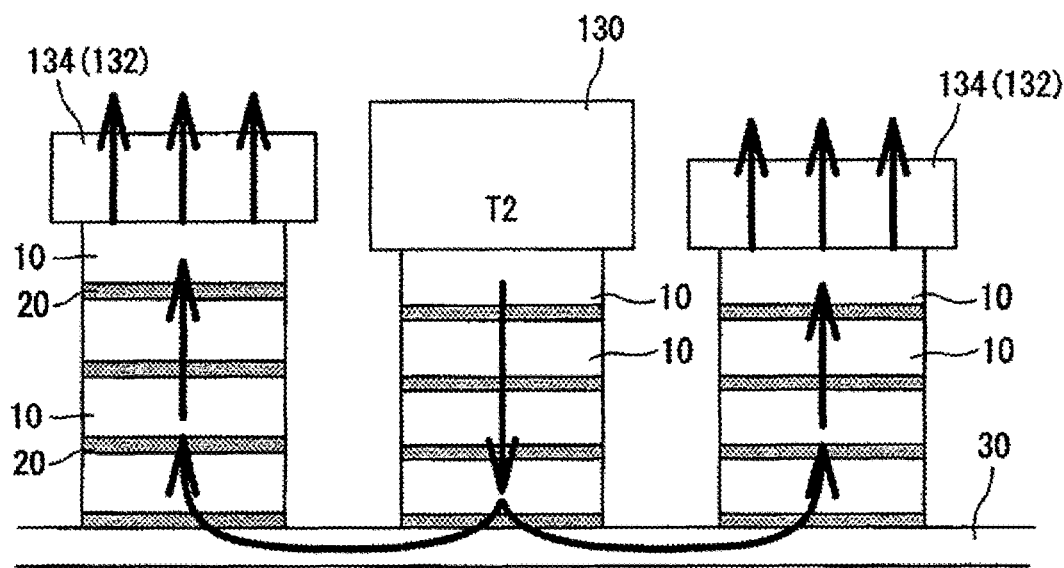
FIG. 8 is a diagram showing a state of final press-attachment in the embodiment.

Next, the final press-attachment performed by using the second mounting head 126 is described with reference to FIG. 8. FIG. 8 is an image view showing a state of performing the final press-attachment by using the second mounting head 126 of the embodiment. In the example of FIG. 8, the temporarily stacked bodies STt are formed at the regions A to C and then the temporarily stacked body STt at the middle region B is finally press-attached. In this case, the press-attaching tool 130 is lowered and is pushed to the upper surface of the temporarily stacked body STt at the region B, which is the target of final press-attachment. Consequently, the temporarily stacked body STt at the region B is heated and pressed. It is needless to say that, when the base 140 is lowered, in order to lower the press-attaching tool 130, the heat-dissipation tools 132 attached to the base 140 are also lowered in connection with the base 140 and the press-attaching tool 130. Consequently, the heat-dissipation tools 132 come into contact with the upper surfaces of the temporarily stacked bodies STt at the regions A and C, which are adjacent to the temporarily stacked body STt being the target of final press-attachment.

Here, slight variations in height occur in the plurality of temporarily stacked bodies STt. For example, in the example of FIG. 8, the temporarily stacked body STt at the region A has a height higher than that of the other temporarily stacked bodies STt. In this case, when the position of the heat-dissipation tool 132 with respect to the base 140 does not change, that is, when the elastic body 138 is not arranged, a problem arises in that, after the heat-dissipation tool 132 comes into contact with the temporarily stacked body STt at the region A, the heat-dissipation tools 132 cannot come into contact with the temporarily stacked bodies STt corresponding to the press-attaching tool 130 and the heat-dissipation tools 132 at the regions B and C. In the embodiment, the heat-dissipation tools 132 are attached to the base 140 via the elastic body 138 and can be displaced with respect to the base 140. Hence, even after one heat-dissipation tool 132 comes into contact with the temporarily stacked body STt, the elastic body 138 of the one heat-dissipation tool 132 is deformed when the base 140 is continuously lowered, and the other heat-dissipation tools 132 and the press-attaching tool 130 are allowed to be further lowered. As a result, the heat-dissipation tool 132 and the plurality of press-attaching tools 130 can reliably come into contact with the corresponding stacked bodies ST. Moreover, at this time, when the elastic body 138 has a high spring constant, a very large force is applied to the temporarily stacked body STt at the region A when the elastic body 138 is deformed. Therefore, the spring constant of the elastic body 138 is adjusted so that a load required for such deformation is equal to or smaller than the load F1 for the temporary press-attachment.

In this manner, in the embodiment, when the temporarily stacked body STt at the region B is finally press-attached, the heat-dissipation tools 132 are brought into contact with the temporarily stacked bodies STt at the regions A and C adjacent to the region B. In this case, as shown by thick arrows in FIG. 8, the heat of the press-attaching tool 130 is transmitted to the temporarily stacked bodies STt at the regions A and C via the temporarily stacked body STt at the region B and the substrate 30. However, in the embodiment, the heat-dissipating body 134 having good thermal conductivity comes into contact with the upper surfaces of the temporarily stacked bodies STt at the regions A and C. Heat transmitted to the temporarily stacked bodies STt at the regions A and C is released to the heat-dissipating body 134 and then released to the outside. As a result, an increase in temperature of the temporarily stacked bodies STt at the regions A and C, which are not the target of final press-attachment, is effectively inhibited. Consequently, the NCFs 20 of the temporarily stacked bodies STt at the regions A and C are prevented from hardening before the final press-attachment, and defective mounting of the semiconductor chip 10 can be effectively prevented.

Here, as a cooling method of the stacked body ST, a method of directly applying a fluid such as cold air or a liquid to the stacked body ST is also considered, in addition to the method of causing a solid (heat-dissipating body 134) having high thermal conductivity to come into contact with the stacked body as in the embodiment. However, it is difficult to limit an application range of the fluid, and there is a concern that the temporarily stacked body STt being the target of final press-attachment which actually needs to be prevented from cooling is likely to be cooled. When the temporarily stacked body STt being the target of final press-attachment is cooled, there is a concern that the NCF 20 insufficiently hardens or the bumps 18 insufficiently melt, and defective mounting is brought about after all. On the other hand, according to a technology of the embodiment in which the heat-dissipating body 134 is brought into contact with the stacked body so that heat is dissipated, the stacked body ST which needs to be cooled can be reliably cooled, and a decrease in temperature of the temporarily stacked body STt which needs to be heated is inhibited. As a result, according to the embodiment, it is possible to effectively prevent defective mounting caused by insufficient temperature or defective mounting caused by hardening of the NCF 20 before the final press-attachment.

Figure 9:
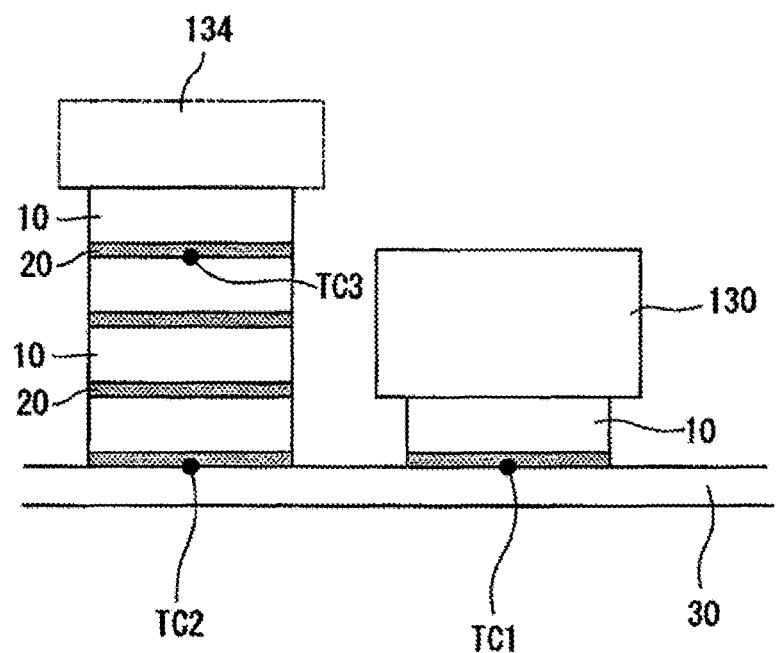
FIG. 9 is a diagram showing an experimental condition.
Figure 10:
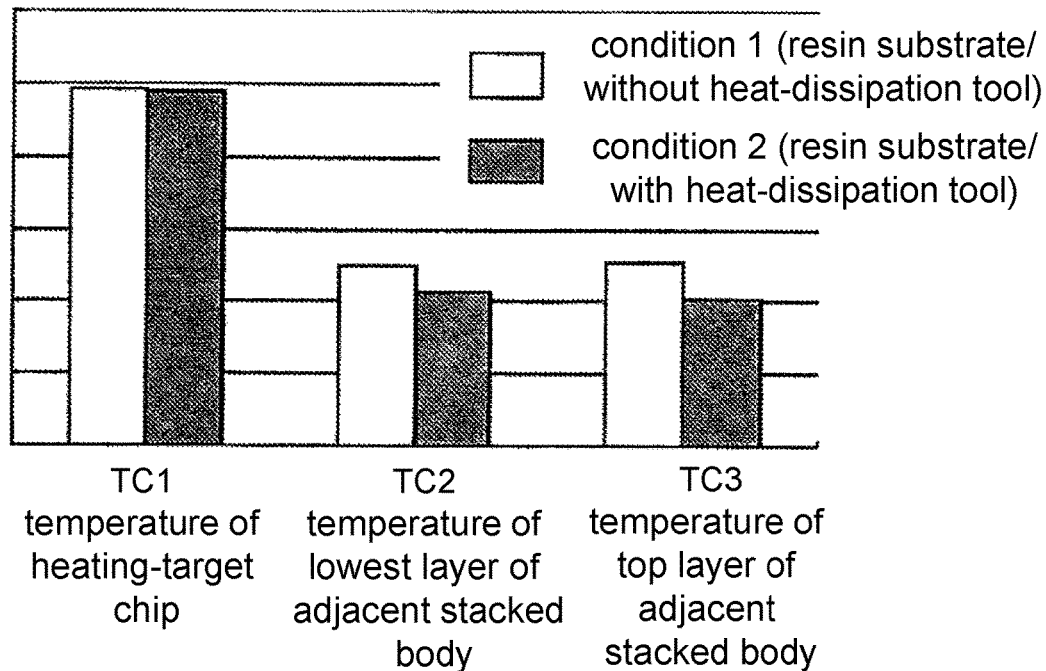
FIG. 10 is a graph showing measurement results in condition 1 and condition 2.
Figure 11:
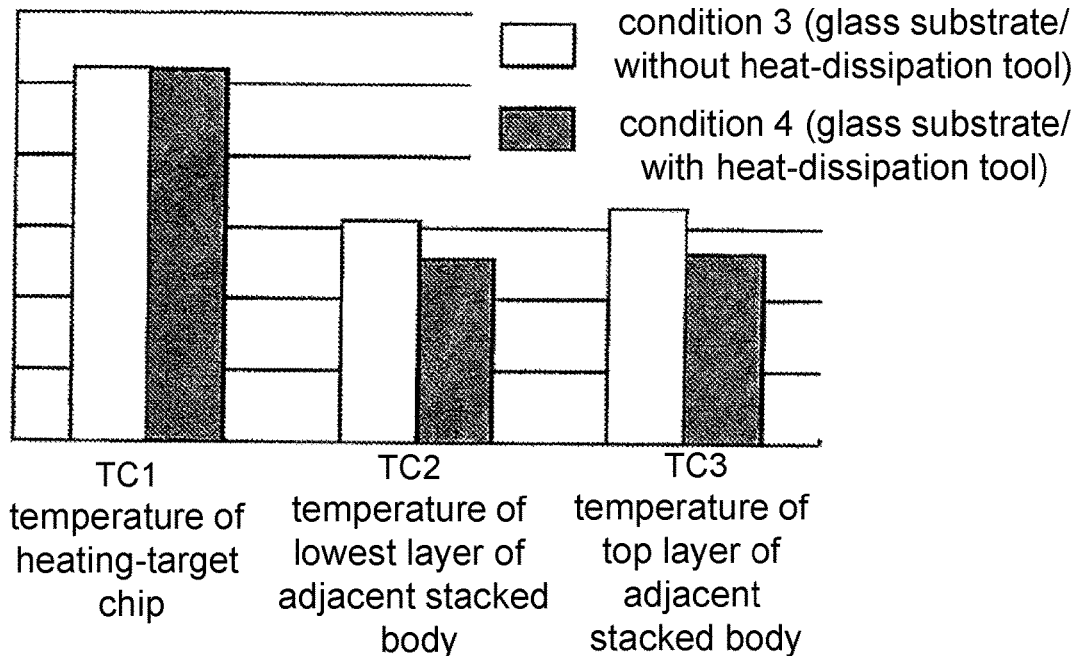
FIG. 11 is a graph showing measurement results in condition 3 and condition 4.

Next, experimental results related with cooling effects achieved by the heat-dissipating body 134 are described. FIG. 9 is a diagram showing an experimental condition. In addition, FIGS. 10 and 11 are graphs showing experimental results. In the experiment, the press-attaching tool 130 is used to heat and press one semiconductor chip 10. Then, at this time, a temperature TC1 of a bottom surface of the semiconductor chip 10 and a temperature TC2 of a bottom surface of the lowest layer and a temperature TC3 of a bottom surface of the top layer of the stacked body ST arranged adjacent to the one semiconductor chip 10 are measured. Although condition 1 and condition 2 are common in that a resin substrate is used as the substrate 30, the conditions are different from each other in that the heat-dissipation tool 132 is not used in condition 1, and the heat-dissipation tools 132 are used to cool the stacked bodies ST in condition 2. Although condition 3 and condition 4 are common in that a glass substrate is used as the substrate 30, the conditions are different from each other in that the heat-dissipation tool 132 is not used in condition 3, and the heat-dissipation tools 132 are used to cool the stacked bodies ST in condition 4.

In FIG. 10, an outline bar represents measured temperatures TC1 to TC3 in condition 1, and a black-painted bar represents measured temperatures TC1 to TC3 in condition 2. In addition, in FIG. 11, an outline bar represents measured temperatures TC1 to TC3 in condition 3, and a black-painted bar represents measured temperatures TC1 to TC3 in condition 4. As clearly understood from FIGS. 10 and 11, there is no big difference between the temperatures TC1 of the semiconductor chip 10 which is heated by the press-attaching tool 130 in conditions 1 and 3 (outline bars) and conditions 2 and 4 (black-painted bars), and there is little side effect on the final press-attachment even when the heat-dissipation tools 132 are arranged. On the other hand, in conditions 2 and 4 (black-painted bars) in which the heat-dissipation tools 132 are used, the temperatures TC2 and TC3 of the adjacent stacked bodies ST are lower, compared with conditions 1 and 3 (outline bars) in which the heat-dissipation tool 132 is not used. In other words, it is known that, according to the embodiment in which the heat-dissipation tools 132 are used, an increase in temperature of the stacked bodies ST adjacent to the stacked body ST being the target of final press-attachment can be inhibited, and hardening or the like of the NCF 20 can be effectively prevented even before the adjacent stacked bodies ST are finally press-attached. On the other hand, even when the heat-dissipation tools 132 are used, a decrease in temperature of the semiconductor chip 10 being the target of final press-attachment is prevented, and thus the semiconductor chip 10 can be finally press-attached reliably.

Moreover, the configuration described above is an example. As long as the mounting head (second mounting head 126) for final press-attachment includes the press-attaching tool 130 that heats and presses the temporarily stacked body STt and the heat-dissipation tools 132 that dissipate heat from other stacked bodies ST adjacent to the temporarily stacked body STt, a configuration other than the configuration described above may be appropriately modified. For example, in the embodiment, the press-attaching tool 130 and the heat-dissipation tools 132 are configured to be integrally lifted and lowered; however, the press-attaching tool 130 and the heat-dissipation tools 132 may be configured to be lifted and lowered independently from each other.

Figure 12:
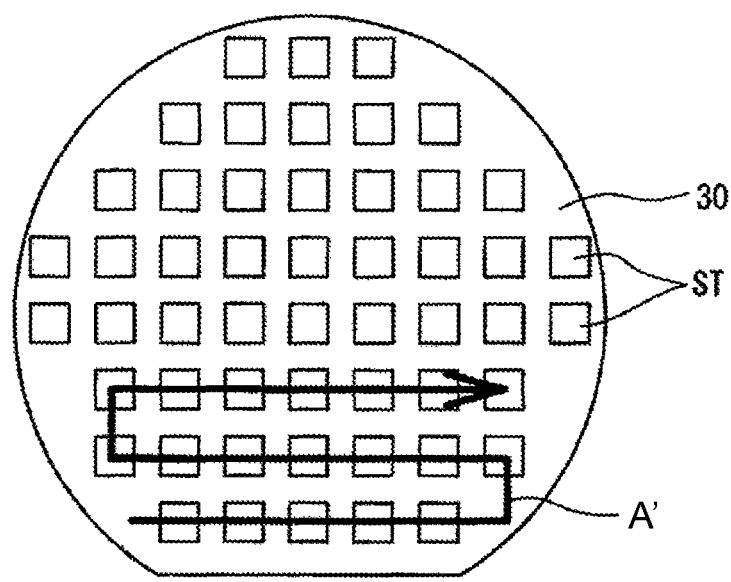
FIG. 12 is a diagram showing an example of a proceeding order of the final press-attachment.
Figure 13:
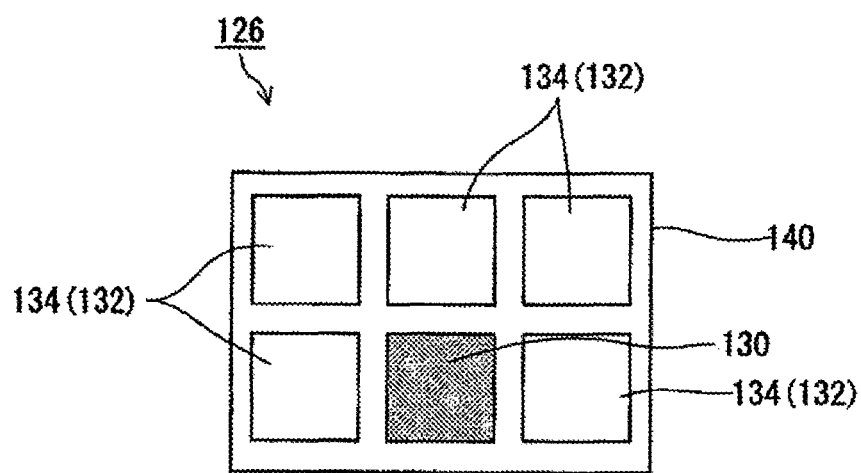
FIG. 13 is a diagram showing an example of another second mounting head.

In addition, in the embodiment, the heat-dissipation tools 132 are arranged in eight directions around the press-attaching tool 130; however, the heat-dissipation tools do not absolutely need to be arranged in the eight directions. For example, as shown by an arrow A' in FIG. 12, a case is considered in which the final press-attachment of the temporarily stacked bodies STt is performed by alternately repeating a step of sequentially proceeding in a right direction and a step of sequentially proceeding in a left direction for each row. In this case, the stacked body ST is not present at a lower side in the drawing than the temporarily stacked body STt being finally press-attached, or even when the stacked body ST is present, the final press-attachment of the stacked body ST is completed. In this case, the heat-dissipation tool 132 does not need to be arranged at a lower side than the press-attaching tool 130 in the drawing. Hence, in this case, as shown in FIG. 13, the heat-dissipation tools 132 may be arranged at totally five locations of both right and left sides of the press-attaching tool 130 and three locations at an upper side in the drawing.

In addition, arrangement intervals between the press-attaching tool 130 and the heat-dissipation tools 132 may be capable of being appropriately changed depending on the arrangement pitches P of the arrangement regions. In addition, in the embodiment, the mounting head (first mounting head 124) for the temporary press-attachment and the mounting head (second mounting head 126) for the final press-attachment are separately arranged; however, the temporary press-attachment and the final press-attachment may also be performed by one mounting head. That is, the first mounting head 124 may not be arranged, and the temporary press-attachment and the final press-attachment may be performed by the second mounting head 126. Here, when the temporary press-attachment is performed, because the heat-dissipation tool 132 does not absolutely need to be arranged, the heat-dissipation tool 132 may be detached from the second mounting head 126 during the temporary press-attachment.

In addition, in the description above, the mounting head (first mounting head 124) for the temporary press-attachment and the mounting head (second mounting head 126) for the final press-attachment are arranged in a single device; however, the mounting heads may be arranged in separate devices, respectively. That is, the technology disclosed in the present application may also be applied to a mounting system including a temporary press-attaching device equipped with the mounting head for temporary press-attachment and a final press-attaching device equipped with the mounting head for final press-attachment.

What is claimed is:

1. A mounting device mounting apparatus for stacking and mounting two or more semiconductor chips at a plurality of locations on a substrate, the mounting apparatus comprising:
    a temporary press-attachment head for forming, at a plurality of locations on the substrate, temporarily stacked bodies in which two or more semiconductor chips are stacked in a temporarily press-attached state; and
    a final press-attachment head for forming chip stacked bodies by sequentially finally press-attaching the temporarily stacked bodies formed at the plurality of locations,
    wherein the final press-attachment head comprises
        a press-attaching tool for heating and pressing an upper surface of a target temporarily stacked body to thereby finally press-attach the two or more semiconductor chips configuring the temporarily stacked body altogether, and
        at least three heat-dissipation tools having a heat-dissipating body which, by coming into contact with an upper surface of another stacked body positioned around the target temporarily stacked body, dissipates heat from the another stacked body,
    wherein the press-attaching tool and the at least three heat-dissipation tools are arranged with the press-attaching tool as a center and the at least three heat-dissipation tools surrounding the press-attaching tool.

2. The mounting apparatus according to claim 1,
    wherein the final press-attachment head has a base to which the press-attaching tool and the heat-dissipation tools are attached, and
    wherein the base is lifted and lowered, and thereby the press-attaching tool and the heat-dissipation tools are lifted and lowered in connection with the base.

3. The mounting apparatus according to claim 2,
    wherein the heat-dissipation tools are attached to the base via an elastic body and is capable of being lifted and lowered with respect to the base within a range of an amount of elastic deformation of the elastic body.

4. The mounting apparatus according to claim 3,
    wherein a height of a bottom surface of the heat-dissipation tools in a no-load state is lower than a height of a bottom surface of the press-attaching tool.

5. The mounting apparatus according to claim 1,
    wherein the heat-dissipating body is cooled by a refrigerant.

6. The mounting apparatus according to claim 1,
    wherein the final press-attachment head has one press-attaching tool and eight heat-dissipation tools, and
    wherein the press-attaching tool and the heat-dissipation tools are arranged in three rows and three columns with the press-attaching tool as a center.

7. The mounting apparatus according to claim 5,
    wherein the final press-attachment head has one press-attaching tool and eight heat-dissipation tools, and
    wherein the press-attaching tool and the heat-dissipation tools are arranged in three rows and three columns with the press-attaching tool as a center.

8. A mounting system for stacking and mounting two or more semiconductor chips at a plurality of locations on a substrate, the mounting system comprising:
    a temporary press-attaching device for forming, at a plurality of locations on the substrate, temporarily stacked bodies in which two or more semiconductor chips are stacked in a temporarily press-attached state; and a final press-attaching device for forming chip stacked bodies by sequentially finally press-attaching the temporarily stacked bodies formed at the plurality of locations by the temporary press-attaching device, wherein the final press-attaching device comprises
- a press-attaching tool for heating and pressing an upper surface of a target temporarily stacked body to thereby finally press-attach the two or more semiconductor chips configuring the temporarily stacked body altogether; and
- at least three heat-dissipation tools having a heat-dissipating body which, by coming into contact with an upper surface of another stacked body positioned around the target temporarily stacked body, dissipates heat from the another stacked body, wherein the press-attaching tool and the at least three heat-dissipation tools are arranged with the press-attaching tool as a center and the at least three heat-dissipation tools surrounding the press-attaching tool.

* * * * *